(12) United States Patent
Shin et al.

(10) Patent No.: US 7,604,750 B2
(45) Date of Patent: Oct. 20, 2009

(54) METHOD FOR FABRICATING SEMICONDUCTOR DEVICE

(75) Inventors: Kyoung-Choul Shin, Chungcheongbuk-do (KR); Seong-Yeol Mun, Chungcheongbuk-do (KR)

(73) Assignee: MagnaChip Semiconductor, Ltd., Chungcheonbuk-Do (KR)

( * ) Notice: Subject to any disclaimer, the term of this patent is extended or adjusted under 35 U.S.C. 154(b) by 381 days.

(21) Appl. No.: 11/282,810

(22) Filed: Nov. 18, 2005

(65) Prior Publication Data
US 2007/0010096 A1    Jan. 11, 2007

(30) Foreign Application Priority Data
Jul. 8, 2005    (KR) .................. 10-2005-0061712

(51) Int. Cl.
H01L 21/302    (2006.01)
(52) U.S. Cl. ......................... 216/58; 216/67
(58) Field of Classification Search .............. 216/58
See application file for complete search history.

(56) References Cited

U.S. PATENT DOCUMENTS

| | | | | |
|---|---|---|---|---|
| 5,681,424 A | * | 10/1997 | Saito et al. ........ | 438/716 |
| 5,756,400 A | * | 5/1998 | Ye et al. ........... | 438/710 |
| 5,781,031 A | * | 7/1998 | Bertin et al. ........ | 326/39 |
| 6,274,058 B1 | * | 8/2001 | Rajagopalan et al. ... | 216/67 |
| 6,374,832 B2 | * | 4/2002 | Chow et al. ......... | 134/1.1 |
| 2001/0008138 A1 | * | 7/2001 | Demos et al. ........ | 134/1.1 |
| 2001/0009245 A1 | * | 7/2001 | Allen, III .......... | 216/2 |
| 2001/0020516 A1 | * | 9/2001 | Khan et al. ......... | 156/345 |
| 2003/0190870 A1 | * | 10/2003 | Shih et al. ......... | 451/39 |

FOREIGN PATENT DOCUMENTS

DE    10355395 A1 *  6/2005
JP    2003059904 A *  2/2003

OTHER PUBLICATIONS

Wolf et al. (Silicon Processing for the VLSI Era; vol. 1; 1986; Lattice Press), p. 546-547 & 618-619.*
SeongYeol Mun et al., "Etch Defect Reduction Using . . . Poly Silicon Etch Process", Japanese Journal of Applied Physics, vol. 44, No. 7A, Jul. 8, 2005, pp. 4891-4895.

* cited by examiner

Primary Examiner—Keith D Hendricks
Assistant Examiner—Patricia A George
(74) Attorney, Agent, or Firm—Blakely, Sokoloff, Taylor & Zafman LLP

(57) ABSTRACT

A method for fabricating a semiconductor device is provided. The method includes: loading a wafer into a chamber including a ceramic dome coated with a material having etch tolerance against a plasma; etching a gate structure formed on the wafer, thereby generating etch remnants; and removing the etch remnants by using a gas of $SF_6$ as a main etch gas.

7 Claims, 8 Drawing Sheets

METHOD FOR FABRICATING SEMICONDUCTOR DEVICE

FIELD OF THE INVENTION

The present invention relates to a method for fabricating a semiconductor device; and, more particularly, to a method for removing polymers generated during an etching process for forming gate structures with use of a photoresist pattern.

DESCRIPTION OF RELATED ARTS

Generally, among various apparatuses used for fabricating semiconductor devices, an etching apparatus is capable of selectively removing a thin film exposed between photoresist patterns after a photoresist developing process. Depending on an etching type, the etching apparatus can be divided into a wet etching apparatus utilizing wet chemicals and a dry etching apparatus utilizing a reaction of gases. Recently, the dry etching apparatus has frequently employed a plasma state of a reaction gas to etch predetermined regions of a wafer.

The etching apparatus typically includes: a chamber on which a wafer is disposed inside; an electrostatic chuck acting as a lower electrode; and a chamber lid opening and closing the chamber. The chamber lid includes: an upper electrode; and a gas reaction unit in which a reaction gas is transformed into a plasma state. However, when the inner wall of the gas reaction unit is exposed to the plasma state of the reaction gas, an aluminum oxide ($Al_2O_3$) layer, which is coated on the inner wall, is scrapped off, resulting in defective processes and a generation of undesired particles. It is often required to replace the entire gas reaction unit periodically. This replacement costs highly and consumes lots of time.

Since by-products produced during semiconductor fabrication processes may cause severe defects in semiconductor fabrication processes, various methods of preventing a generation of such by-products have been proposed.

Those by-products generated during an etching process are generally deposited on almost every parts of the chamber. Particularly, an excessive or unstable deposition of such by-products may act as a defect in a wafer.

The by-products commonly called polymers are generally generated as the reaction gas and an etch target react with each other. Although most of the polymers are sucked out of the chamber through an exhaustion device, the polymers may still remain on those exposed parts of the chamber depending on process recipes.

As for highly integrated semiconductor devices, it is difficult to secure delicate process recipes. Especially, in the case of forming gate structures, a high etch selectivity ratio is often required due to certain profiles of gate electrodes (e.g., polysilicon) and a current trend in forming gate oxide layers in thin films. As a result, etch recipes which produce high amounts of polymers have been inevitably selected to meet the above requirements.

Hence, it has been more focused to remove the polymers or control an amount of the polymers than to prevent the polymer generation fundamentally. As a reference, an AMAT DPS polycrystalline silicon etching apparatus is commonly used for forming gate structures.

FIG. 1 is a diagram briefly illustrating the inner side of a chamber for an etching process, wherein polymers are generated and deposited on the inner wall of the chamber.

As for the etching process for etching gate electrodes using photoresist patterns, if the etching process is performed in the state that a wafer 13 is disposed on an electrostatic chuck 12 inside the chamber 11, the aforementioned polymers 14 remain on the wafer 13, sidewalls 11A and a dome-shaped top surface 11B of the chamber 11.

Particularly, the photoresist patterns and oxide-based materials formed on the wafer 13 produce by-products, i.e., the polymers 14 as the photoresist patterns and the oxide-based materials are etched. Although most of the polymers 14 are sucked out of the chamber 11 through an exhaustion device (not shown), some of the polymers 14 still remain on parts of the chamber 11 and become solidified. The solidified polymers 14 are grown up to certain sizes and dropped down on the wafer 13, causing a decrease in the device yield.

For instance, when a polysilicon layer for use in a gate structure is dry etched using a photoresist pattern as an etch mask, gases such as HBr, $Cl_2$ and $O_2$ gases are used as a main gas, and the polymers 14 generated after the dry etching process are mixtures such as $Si(Br,Cl)_xO_y$, $CH_xO_y$ or $AlF_x$.

FIG. 2 is a graph depicting a relationship between the number of particles generated during an etching process and the number of accumulative wafers of a DPS etching apparatus.

In the case of more than 400 accumulative wafers, as depicted in FIG. 2, the etch particles which are excessively deposited are dropped down. A removal of the excessively deposited etch particles is carried out by disassembling parts of the etching apparatus, cleaning the parts and reassembling the parts. However, this cleaning is not a fundamental solution for the removal of the etch particles. The particle generation on the wafers is inevitable during the etching process and requires a frequent cleaning, and a required cleaning cycle is often shortened, resulting in high costs and time consumption.

As mentioned above, high amounts of polymers are generated when wafers are etched at a chamber of an etching apparatus after a wet cleaning process, and the polymer generation increases in proportion to the time. The polymers tend to drop down on the wafers, impeding an etching of those regions where the polymers are dropped down. This impediment may result in a decrease in the device yield. Also, a frequent wet cleaning of the etch chamber to remove the polymers and replacements of the expensive parts of the etching apparatus may increase maintenance costs of the etching apparatus.

SUMMARY OF THE INVENTION

It is, therefore, an object of the present invention to provide a method for fabricating a semiconductor device suitable for improving process efficiency by preventing a deposition of polymers generated during an etching of gate electrodes within a chamber.

In accordance with an aspect of the present invention, there is provided a method for fabricating a semiconductor device, including: loading a wafer into a chamber including a ceramic dome coated with a material having etch tolerance against a plasma; etching a gate structure formed on the wafer, thereby generating etch remnants; and removing the etch remnants by using a gas of $SF_6$ as a main etch gas.

In accordance with another aspect of the present invention, there is provided a method for fabricating a semiconductor device, including: loading a wafer into a chamber including a ceramic dome coated with a material having etch tolerance against a plasma; etching a gate structure formed on the wafer, thereby generating etch remnants; removing the etch remnants using a gas of $SF_6$ as a main etch gas; and performing a recovery process.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a semiconductor device in accordance with exemplary embodiments of the present invention will be described in detail with reference to the accompanying drawings.

Figure 1:
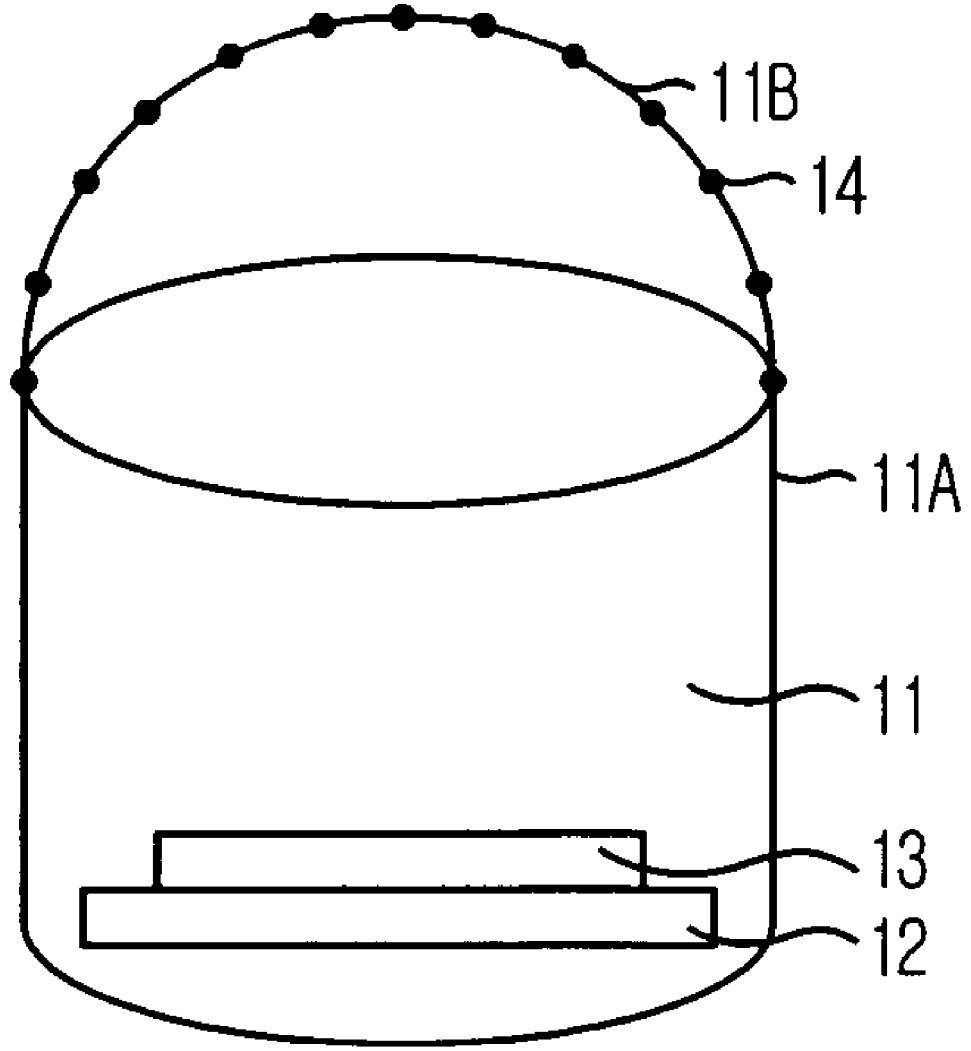
FIG. 1 is a diagram illustrating a chamber of a conventional etching apparatus.
Figure 2:
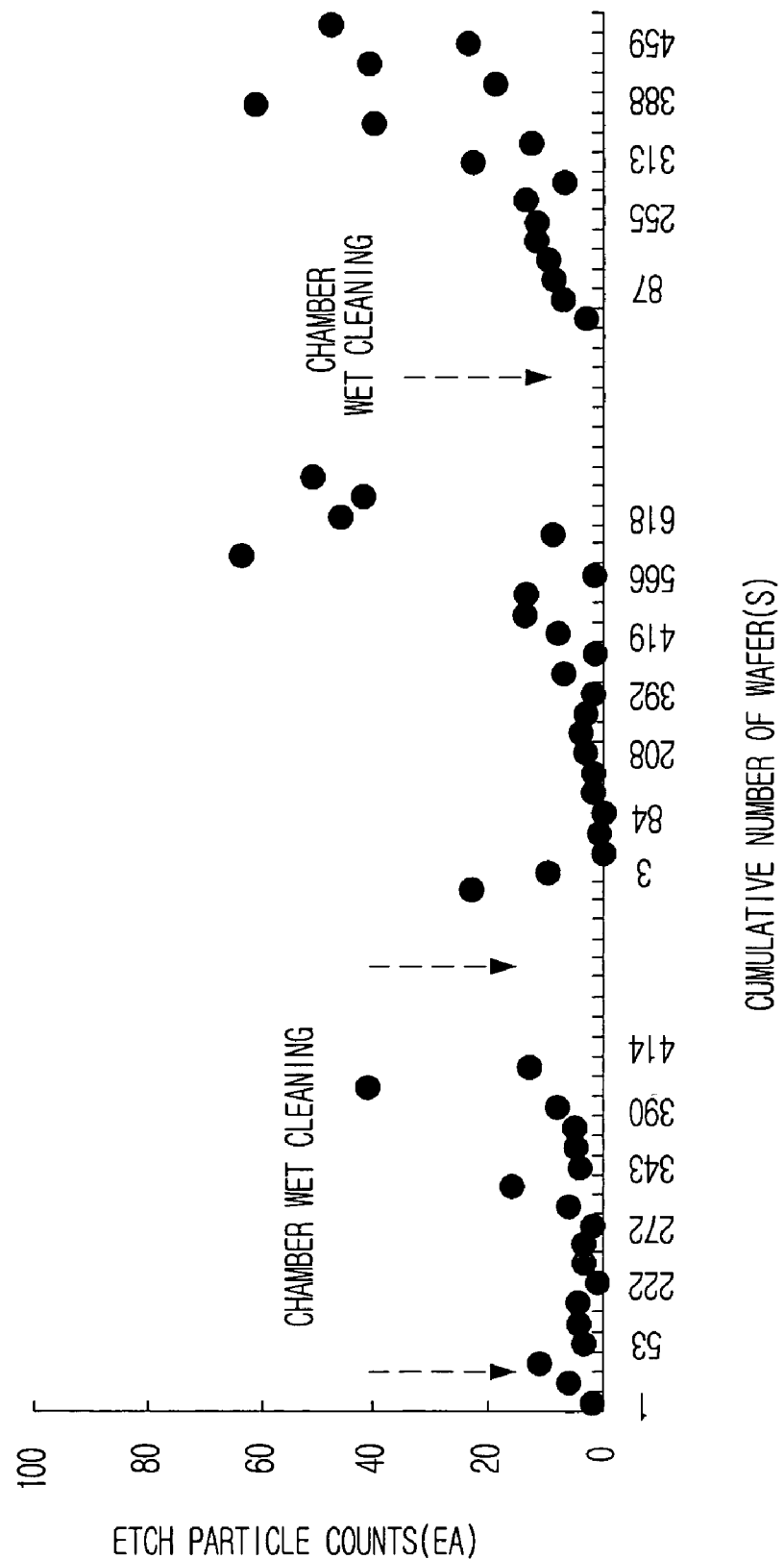
FIG. 2 is a graph depicting a relationship between the number of accumulative wafers and the number of etch particles.
Figure 3:
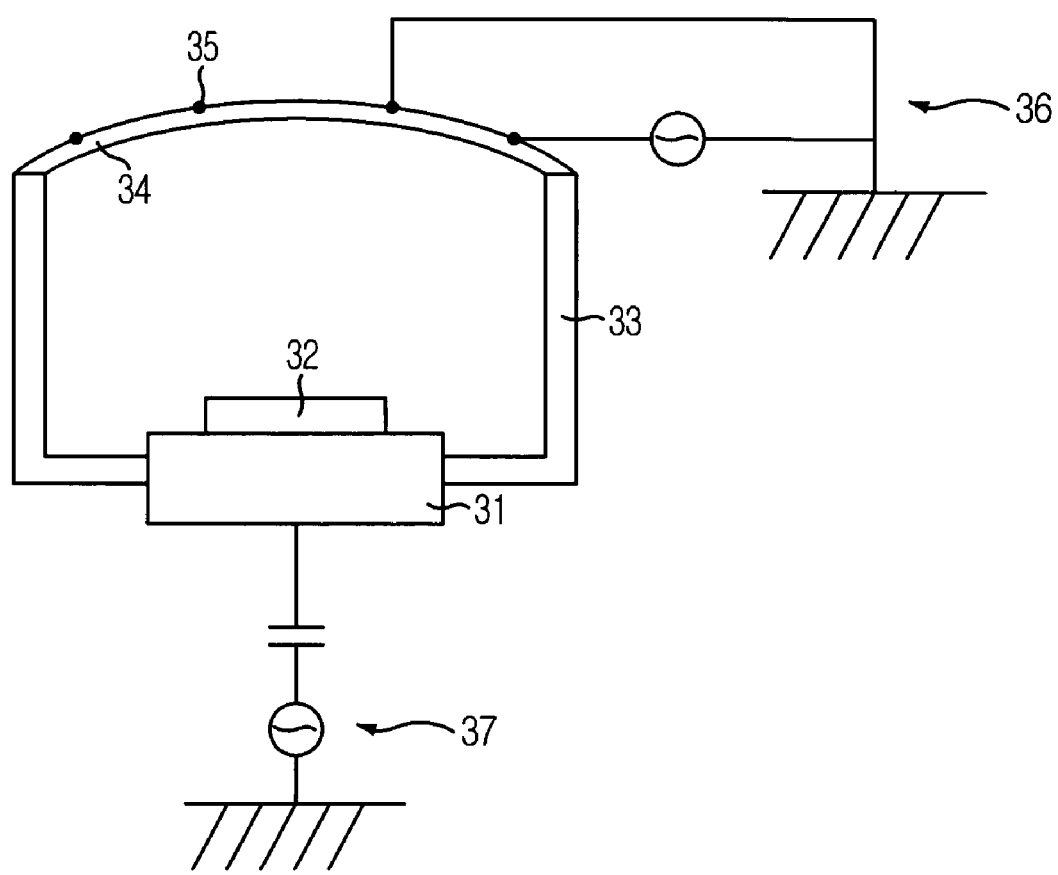
FIG. 3 is a diagram illustrating a chamber of an etching apparatus in accordance with a specific embodiment of the present invention.

FIG. 3 is a diagram illustrating a chamber of an etching apparatus in accordance with a specific embodiment of the present invention.

The chamber of the etching apparatus includes: an electrostatic chuck 31; a wafer 32 disposed on the electrostatic chuck 31; sidewalls 33; a ceramic dome 34 connected with the sidewalls 33; and an antenna coil 35 formed on an outer surface of the ceramic dome 34. The reaction chamber further includes: a source voltage supply terminal 36 connected with a part of the antenna coil 35; and a base voltage supply terminal 37 connected with the electrostatic chuck 31.

The ceramic dome 34 is coated with yttrium oxide ($Y_2O_3$), which has good etch tolerance against a plasma. Therefore, using the above chamber, a dry cleaning process is performed to remove polymers generated during an etching of gate structures. The dry cleaning process utilizes $SF_6/O_2$ gas as an etch gas instead of a conventionally used $CF_4/Cl_2$ gas. The $SF_6/O_2$ gas can give a higher etch amount than the $CF_4/Cl_2$ gas and thus, it is possible to clean the chamber as clean as a wet cleaning process does. Particularly, it is possible to clean the ceramic dome 34 which is considered as one cause of the polymer generation.

Figure 4:
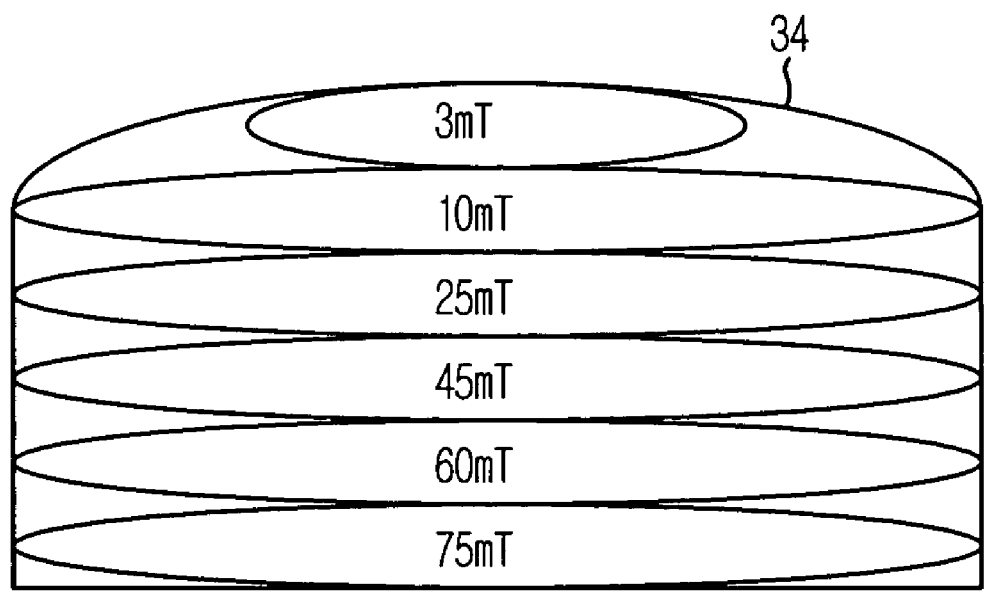
FIG. 4 is a diagram illustrating a ceramic dome indicating various positions where a cleaning process takes place depending on pressure conditions.

FIG. 4 is a diagram illustrating the ceramic dome indicating different positions of a cleaning process depending on pressure conditions.

As illustrated, all positions of the ceramic dome 34 can be uniformly cleaned using a multi-step process performed at different ranges of pressure from approximately 3 mTorr to approximately 90 mTorr. The ceramic dome 34 is cleaned by supplying approximately 1,600 W of a source power and approximately 50 W of a bias power through the corresponding supply terminals for approximately 50 seconds. At this time, approximately 200 sccm of $SF_6$ gas and approximately 50 sccm of $O_2$ gas are provided per hour.

Figure 5A:
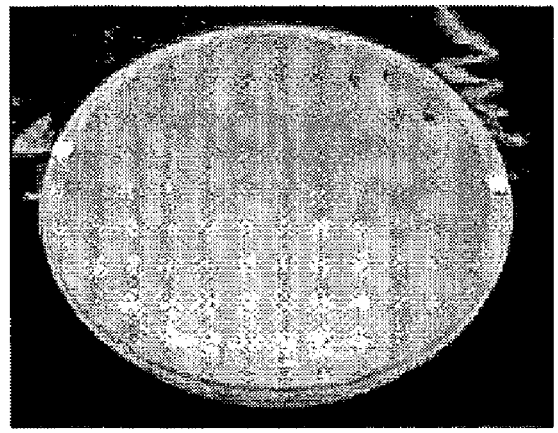
FIGS. 5A to 5C are micrographic images of transmission electron microscopy showing states of ceramic domes at different stages of processes.
Figure 5B:
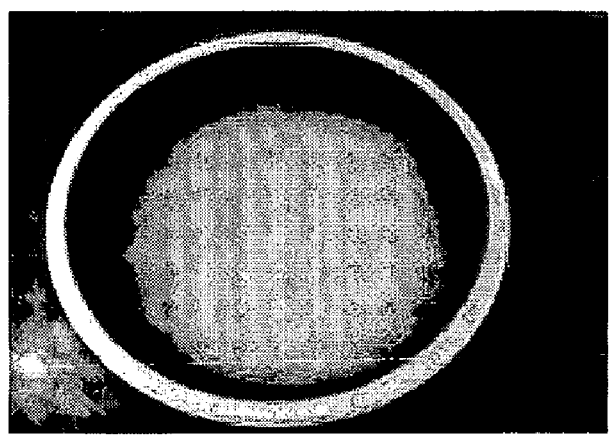
Figure 5C:
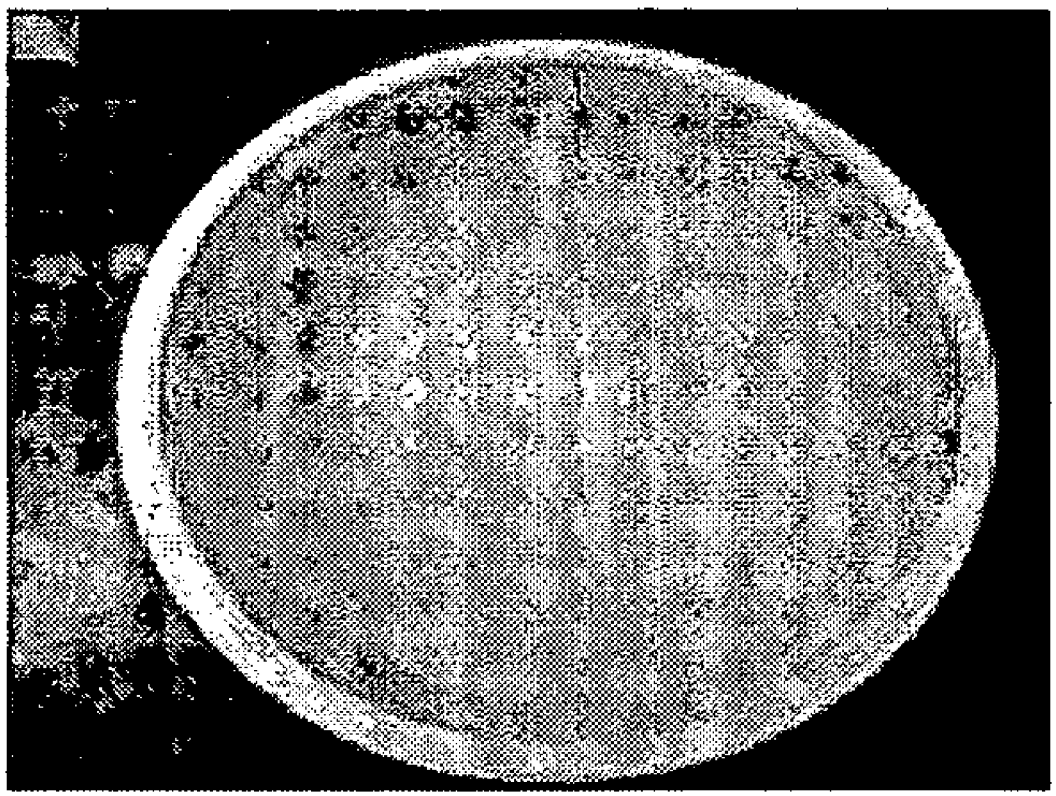

FIGS. 5A to 5C are micrographic images of transmission electron microscopy (TEM) showing different states of a ceramic dome at different stages of processes in accordance with the specific embodiment of the present invention.

Particularly, FIG. 5A shows the state of the ceramic dome before a wafer is loaded. FIG. 5B shows the state of the ceramic dome after approximately 100 wafers are accumulated. FIG. 5C shows the state of the ceramic dome after a dry cleaning process is performed.

When the dry cleaning process is performed, a bare silicon wafer is used to prevent damage to an electrostatic chuck on which the wafer is placed. After the dry cleaning process using $SF_6/O_2$ gas, a process shift event that an etch rate decreases occur, and thus, it is required to perform an additional process to recover the original etch rate.

Hence, a recovery recipe is added at the last step of the dry cleaning process implemented on the ceramic dome, thereby generating etch by-products including silicon. The addition of the recovery recipe minimizes unnecessary process changes caused by the dry cleaning process and makes it possible to manufacture products immediately. The recovery recipe after the dry cleaning process is as follows. A source power of approximately 500 W and a bias power of approximately 80 W are provided at approximately 10 mTorr. Also, approximately 100 sccm of HBr, approximately 40 sccm of $Cl_2$, approximately 10 sccm of He, and approximately 1 sccm of $O_2$ are injected for approximately 100 seconds.

Figure 6:
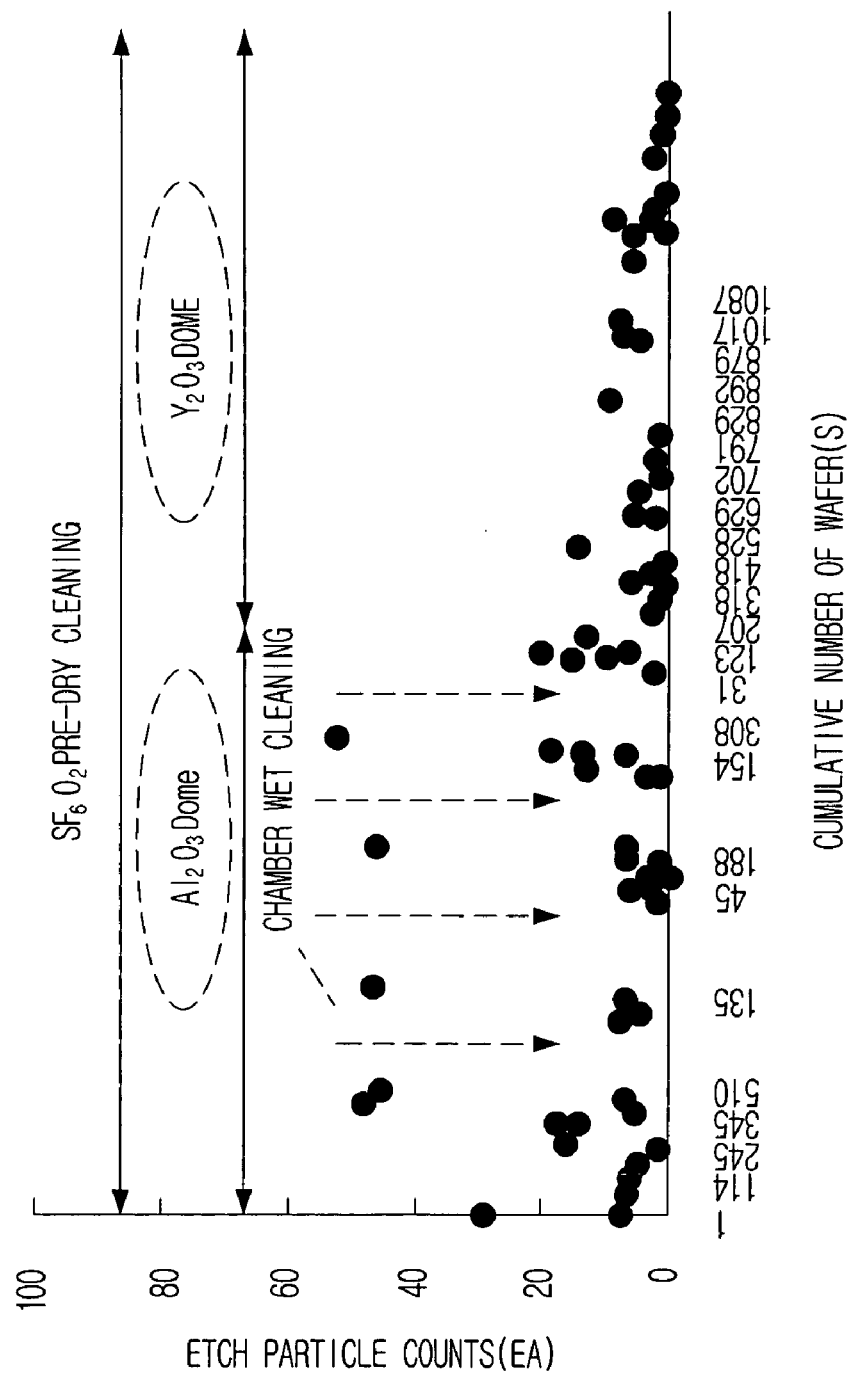
FIG. 6 is a graph showing a comparison result between a conventional dome coated with aluminum oxide ($Al_2O_3$) and a dome coated with yttrium oxide ($Y_2O_3$) according to the specific embodiment of the present invention.

FIG. 6 is a graph illustrating an analysis result obtained by comparing one case of employing a conventional $Al_2O_3$-coated ceramic dome with the other case of employing $Y_2O_3$-coated ceramic dome according to the specific embodiment of the present invention.

When the dry cleaning process is performed on the conventional $Al_2O_3$-coated ceramic dome using $SF_6$ gas, an aluminum fluoride ($AlF_x$)-based layer is formed on a surface of the $Al_2O_3$-coated ceramic dome. However, the $AlF_x$-based layer blocks a stable deposition of Si-based by-products, thereby causing a polymer generation. Hence, according to the specific embodiment of the present invention, since $Y_2O_3$ has a good plasma characteristic, an $Y_2O_3$-coated ceramic dome is used to help a stable deposition of by-products generated during the dry cleaning process. If $Y_2O_3$ is not used, there is no difference in the cleaning effect, but there is no polymer removal effect.

The dry cleaning process using $SF_6/O_2$ gas remove deposited remnants with regardless of material types of the chamber, and thus, the cleaning capability is not affected by a material for forming the ceramic dome. In view of an analysis on the compositions of the remnants depending on various materials for forming the ceramic dome during the dry cleaning process, the polymers are easily removed in the case of the $Y_2O_3$-coated ceramic dome and the dry cleaning process using $SF_6/O_2$ gas. Thus, it is essential to combine the use of the $Y_2O_3$-coated ceramic dome with the aforementioned dry cleaning process.

Figure 7:
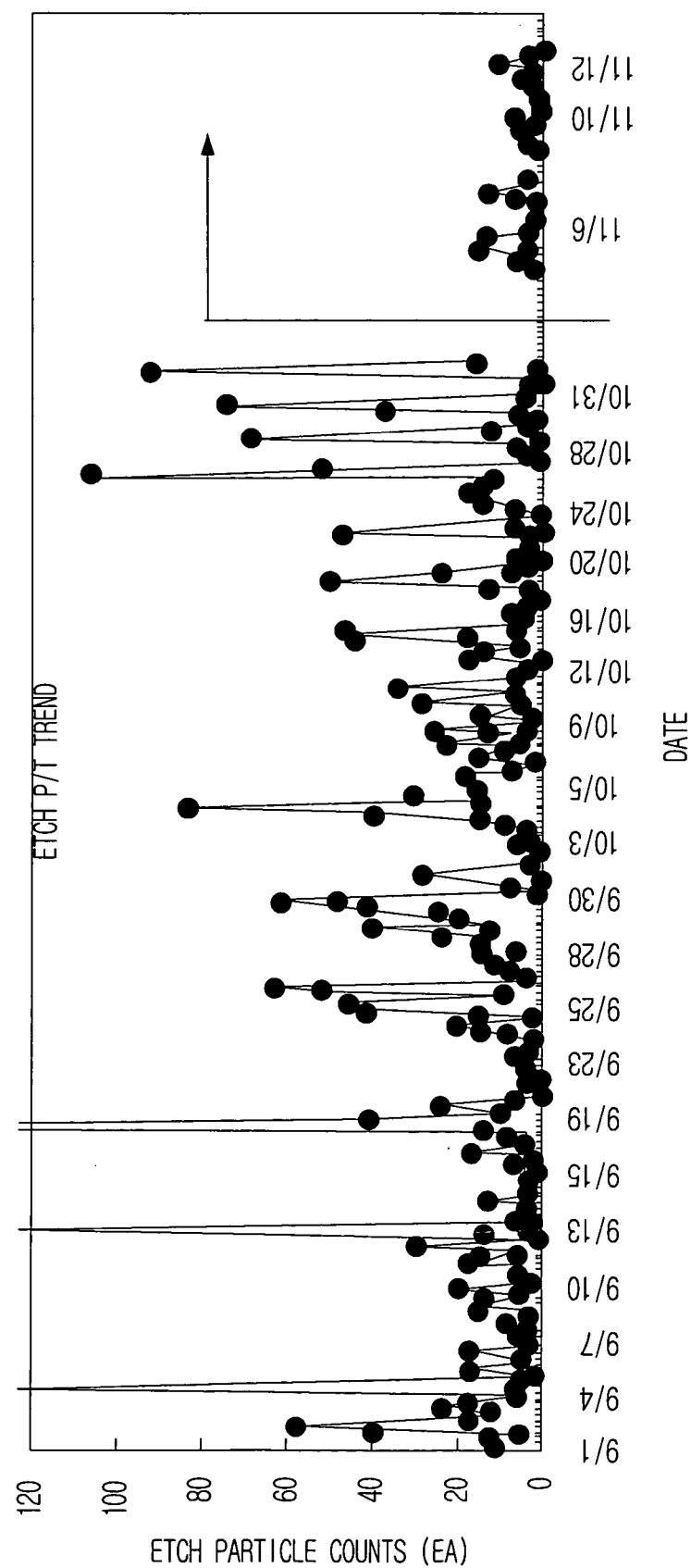
FIG. 7 is a graph illustrating an effect resulted when the specific embodiment of the present invention is implemented.

FIG. 7 is a graph illustrating an effect of the specific embodiment of the present invention implemented over a certain period.

As illustrated, when $SF_6/O_2$ gas is used for the dry cleaning process, a frequency of the particle generation is decreased.

Although the use of $SF_6/O_2$ gas is exemplified in this specific embodiment, a mixture gas of $CF_4/Cl_2/O_2$ can be used as an etch gas for the dry cleaning process.

According to the specific embodiment of the present invention, a shortened wet cleaning cycle can reduce manufacturing costs, time consumption and improve convenience in manipulating processes. As a result, productivity can be enhanced, and the particle generation can be decreased by approximately 70% or higher, resulting in an improvement on device yields.

The present application contains subject matter related to the Korean patent application No. KR 2005-0061712, filed in the Korean Patent Office on Jul. 8, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising:
    loading a wafer into a chamber including vertical sidewalls and a curved ceramic dome coated with a material having etch tolerance against a plasma, wherein the material is yttrium oxide;
        etching a gate structure formed on the wafer, thereby generating etch remnants;
    and removing the etch remnants by:
    using a gas of SF6 as a main etch gas, and
    wherein the vertical sidewalls and the curved ceramic dome are uniformly cleaned using a multi-step cleaning process including a plurality of steps in which the removing of the etch remnants on the curved ceramic dome is performed at pressures lower than that on the vertical sidewalls,
    wherein the removing of the etch remnants is performed under a source power of approximately 1,600 W supplied to an antenna coil and different pressures ranging from approximately 3 mTorr to approximately 90 mTorr,
    wherein the vertical sidewalls are cleaned from positions progressing along the vertical sidewalls in multiple steps, and wherein the chamber pressure is reduced in each of the multiple steps.

2. The method of claim 1, wherein the removing of the etch remnants is carried out by employing a dry cleaning process using a mixture gas obtained by mixing the $SF_6$ gas with oxygen ($O_2$) gas.

3. The method of claim 1, wherein the mixture gas is supplied for approximately 50 seconds at a source power of approximately 1,600 W and a bias power of approximately 50 W.

4. A method for fabricating a semiconductor device, comprising:
    loading a wafer into a chamber including vertical sidewalls and a curved ceramic dome coated with a material having etch tolerance against a plasma, wherein the material is yttrium oxide or diyttrium trioxide;
        etching a gate structure formed on the wafer, thereby generating etch remnants; and removing the etch remnants by:
    using a gas of SF6 as a main etch gas, and
    performing a recovery process,
    wherein the vertical sidewalls and the curved ceramic dome are uniformly cleaned using a multi-step cleaning process including a plurality of steps in which the removing of the etch remnants on the curved ceramic dome is performed at pressures lower than that on the vertical sidewalls,
    wherein the removing of the etch remnants is performed under a source power of approximately 1,600 W supplied to an antenna coil and different pressures ranging from approximately 3 mTorr to approximately 90 mTorr,
    wherein the sidewalls are cleaned from positions progressing along the vertical sidewalls in multiple steps, and wherein the chamber pressure is reduced in each of the multiple steps.

5. The method of claim 4, wherein the removing of the etch remnants is carried out by employing a dry cleaning process using a mixture gas obtained by mixing the SF6 gas with oxygen ($O_2$) gas.

6. The method of claim 4, wherein the mixture gas is supplied for approximately 50 seconds at a source power of approximately 1,600 W and a bias power of approximately 50 W.

7. The method of claim 4, wherein the performing of the recovery process is carried out by: supplying a source power of approximately 500 W and a bias power of approximately 80 W at a pressure of approximately 10 mTorr; and supplying hydrogen bromide (HBr) gas of approximately 100 sccm, helium (He) gas of approximately 40 sccm and oxygen ($O_2$) gas of approximately 1 sccm for approximately 100 seconds.

* * * * *

UNITED STATES PATENT AND TRADEMARK OFFICE
CERTIFICATE OF CORRECTION

| | | |
|---|---|---|
| PATENT NO. | : 7,604,750 B2 | Page 1 of 1 |
| APPLICATION NO. | : 11/282810 | |
| DATED | : October 20, 2009 | |
| INVENTOR(S) | : Shin et al. | |

It is certified that error appears in the above-identified patent and that said Letters Patent is hereby corrected as shown below:

Column 6, Claim 4, line 26, after "the", insert -- vertical --
Column 6, Claim 5, line 32, delete "SF6", insert -- $SF_6$ --

Signed and Sealed this

Sixth Day of July, 2010

David J. Kappos
*Director of the United States Patent and Trademark Office*